United States Patent
Kim

(10) Patent No.: US 9,196,350 B2
(45) Date of Patent: Nov. 24, 2015

(54) ACTIVE CONTROL DEVICE, SEMICONDUCTOR DEVICE AND SYSTEM INCLUDING THE SAME

(71) Applicant: SK hynix Inc., Icheon-si Gyeonggi-do (KR)

(72) Inventor: Jin Ah Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/231,262

(22) Filed: Mar. 31, 2014

(65) Prior Publication Data

US 2015/0187406 A1    Jul. 2, 2015

(30) Foreign Application Priority Data

Dec. 31, 2013  (KR) .................. 10-2013-0168658

(51) Int. Cl.
  *G11C 7/00*  (2006.01)
  *G11C 11/4076*  (2006.01)
  *G11C 11/402*  (2006.01)
  *G11C 11/408*  (2006.01)

(52) U.S. Cl.
  CPC .......... *G11C 11/4076* (2013.01); *G11C 11/402* (2013.01); *G11C 11/4085* (2013.01)

(58) Field of Classification Search
  CPC .............. G11C 11/406; G11C 11/4074; G11C 11/40618; G11C 2211/4067; G11C 29/50012; G11C 11/401; G11C 11/40622; G11C 8/18; G11C 11/4091; G11C 8/08; G11C 11/403; G11C 29/783; G11C 11/4087; G11C 2029/1202
  USPC ............... 365/222, 230.03, 203, 194, 230.06, 365/189.08, 230.01, 230.08
  See application file for complete search history.

(56) References Cited

U.S. PATENT DOCUMENTS 7,911,862 B2    3/2011  Kim et al.
2002/0060940 A1*  5/2002  Tomita .......................... 365/222

FOREIGN PATENT DOCUMENTS

KR    1020050101872 A    10/2005
KR    100925369 B1    10/2009
KR    1020110131724 A    12/2011

* cited by examiner

*Primary Examiner* — Thong Q Le
(74) *Attorney, Agent, or Firm* — William Park & Associates Ltd.

(57) ABSTRACT

Disclosed herein are an active control device, a semiconductor device and system including the same. The active control device may include a refresh control unit configured for outputting a refresh signal by controlling a delay time for a refresh start time when a refresh operation is performed and a precharge signal generation unit configured for generating a bank precharge signal for precharging a bank in response to the refresh signal. The refresh control unit may include a refresh delay unit for delaying a bank-active signal for a specific time and outputting a delay signal, and the refresh delay unit may be operably coupled with a plurality of banks in common.

17 Claims, 10 Drawing Sheets

ACTIVE CONTROL DEVICE, SEMICONDUCTOR DEVICE AND SYSTEM INCLUDING THE SAME

CROSS-REFERENCES TO RELATED APPLICATION

The present application claims priority under 35 U.S.C. §119(a) to Korean application number 10-2013-0168658, filed on Dec. 31, 2013, in the Korean Intellectual Property Office, which is incorporated herein by reference in its entirety.

TECHNICAL FIELD

Various embodiments generally relate to an active control device and a semiconductor device including the same, and more particularly, to technology in which a bank-active operation can be controlled through a common delay unit.

BACKGROUND

In general, a semiconductor memory device includes a plurality of banks. A bank is a functional unit that can be accessed independently, and the bank includes a memory cell array, a sense amplifier array, an address decoder, and so on.

In general, in order to access a specific memory cell of a specific bank, first, a row (i.e., word line) of a corresponding bank is activated by applying an active command for controlling a row line. Next, sense amplification and re-storage processes are performed on a specific column (i.e., a bit line) by applying a read/write command for controlling a column line. When access to the corresponding bank is terminated, the row of the corresponding bank is deactivated by applying a precharge command.

A semiconductor memory device, in particular, Dynamic RAM (DRAM) performs a precharge operation for charging bit lines with a specific voltage in order to rapidly write and read data and close a bank of an active state.

In general, RAS active-time lookout (tRAM lookout or tRAM minimum time) using a clock outside a semiconductor memory device may be controlled by technology using a delay chain and an RC delay unit.

A conventional active control device may include an additional RC delay unit in each bank in order to control the delay operation of a normal RAS access time tRAS when a refresh operation is performed.

The conventional active control device may include a delay unit for delaying an RAS access time tRAS in a normal operation and a delay unit for delaying an RAS access time tRAS in a refresh operation in each bank, thereby increasing the total area of a control device.

SUMMARY

In an embodiment, an active control device may include a refresh control unit configured for outputting a refresh signal by controlling a delay time for a refresh start time when a refresh operation is performed and a precharge signal generation unit configured for generating a bank precharge signal for precharging a bank in response to the refresh signal. The refresh control unit may include a refresh delay unit for delaying a bank-active signal for a specific time and outputting a delay signal, and the refresh delay unit is operably coupled with a plurality of banks in common.

In an embodiment, a semiconductor device may include a bank address decoder configured for outputting a bank address by decoding a bank selection signal, a precharge controller configured for outputting a refresh signal by controlling a delay time for a refresh start time when a refresh operation is performed and configured for generating a bank precharge signal for precharging a bank in response to the refresh signal, and a core region configured for precharging a bank region in response to the bank precharge signal.

In an embodiment, a system may include: a processor; a chipset configured to couple with the processor; a memory controller configured to receive a request provided from the processor through the chipset; and an active control device configured to receive the request and output data to the memory controller, the active control device including: a refresh control unit configured for outputting a refresh signal by controlling a delay time for a refresh start time when a refresh operation is performed; and a precharge signal generation unit configured for generating a bank precharge signal for precharging a bank in response to the refresh signal, wherein the refresh control unit comprises a refresh delay unit for delaying a bank-active signal for a specific time and outputting a delay signal, and the refresh delay unit is operably coupled with a plurality of banks in common.

BRIEF DESCRIPTION OF THE DRAWINGS

Features, aspects, and embodiments are described in conjunction with the attached drawings, in which.

DETAILED DESCRIPTION

Hereinafter, an active control device and a semiconductor device including the same according to the present disclosure will be described below with reference to the accompanying drawings through various examples of embodiments.

Figure 1:
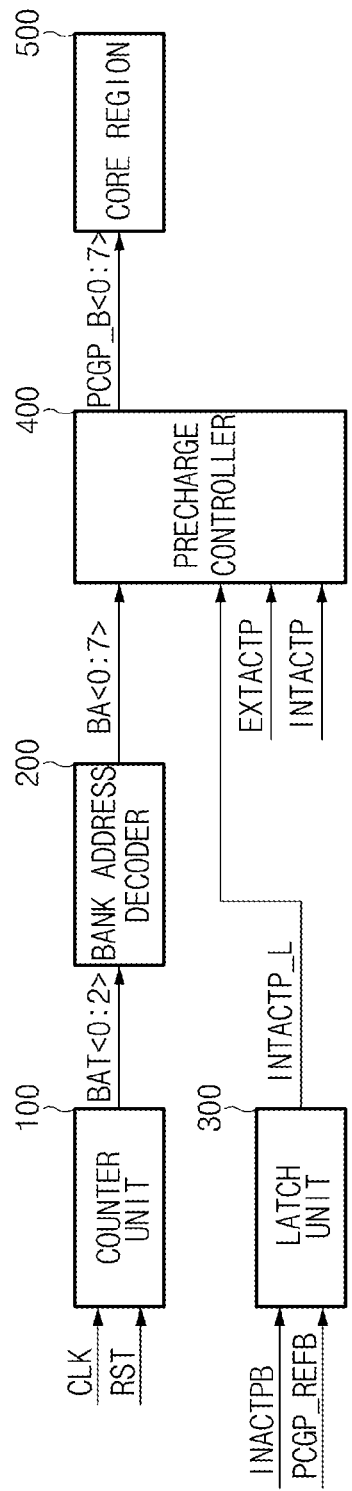
FIG. 1 shows the construction of an active control device in accordance with an embodiment.

FIG. 1 shows the construction of an active control device in accordance with an embodiment.

A semiconductor device in accordance with an embodiment may include a counter unit 100, a bank address decoder 200, a latch unit 300, a precharge controller 400, and a core region 500.

The counter unit 100 may output bank selection signals BAT<0:2> to the bank address decoder 200 by counting a clock CLK. The counting operation of the counter unit 100 may be reset in response to a reset signal RST. In an embodiment, three bank selection signals BAT have been illustrated as being output, but the embodiments are not limited thereto. The number of bank selection signals is not limited.

The bank address decoder 200 may output bank addresses BA<0:7> to the precharge controller 400 by decoding the bank selection signals BAT<0:2>. The eight bank addresses BAT<0:7> may correspond to eight banks within the core region 500, respectively.

In an embodiment, the eight addresses BA<0:7> have been illustrated as being output, but the embodiments are not limited thereto. The number of bank addresses and the number of banks are not limited to the above examples.

The latch unit 300 may latch an active signal INACTPB for a specific time in response to a refresh signal PCGP_REFB and may output an active latch signal INTACTP_L to the precharge controller 400.

The precharge controller 400 may output a refresh signal PCGP_REF. This refresh signal PCGP_REF may be fed back into the precharge controller 400, the details of which will be discussed with reference to FIG. 5 below. The precharge controller 400 may also output bank precharge signals PCGP_B<0:7> to the core region 500 by controlling a precharge operation in response to the bank addresses BA<0:7>, the active latch signal INTACTP_L, an active command signal EXTACTP, and the active signal INACTP.

Furthermore, the core region 500 precharges a bank region in accordance with the bank precharge signals PCGP_B<0:7> received from the precharge controller 400. The core region 500 is assumed to include eight banks, but the embodiments are not limited thereto. The number of banks is not limited to such an assumption.

Figure 2:
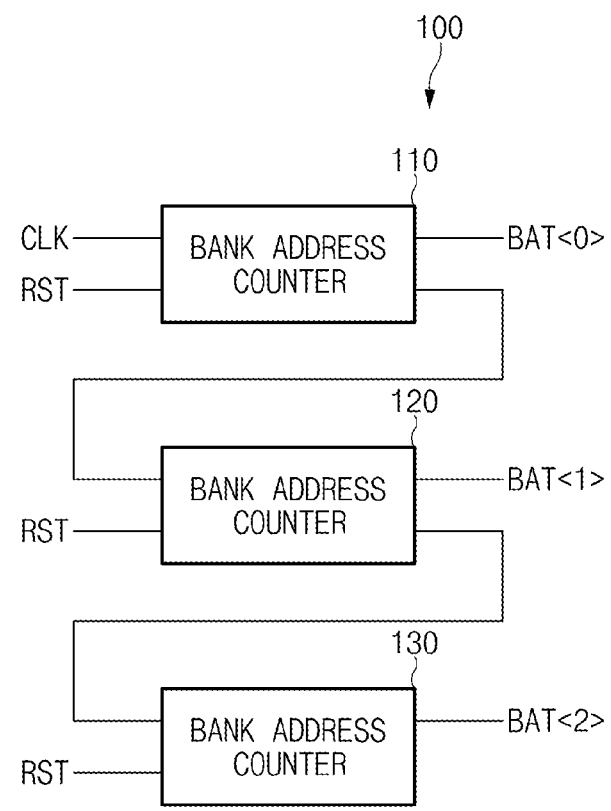
FIG. 2 shows a detailed construction of a counter unit shown in FIG. 1.

FIG. 2 shows a detailed construction of the counter unit 100 shown in FIG. 1.

The counter unit 100 may include a plurality of bank address counters 110, 120, and 130. The plurality of bank address counters 110, 120, and 130 may be coupled in series in such a manner that the output of a counter in a front stage is inputted to the input terminal of a counter in a rear stage.

The first bank address counter 110 may output the bank selection signal BAT<0> by counting the clock CLK. The counting operation of the first bank address counter 110 is reset in response to the reset signal RST.

The second bank address counter 120 may output the bank selection signal BAT<1> by counting the bank selection signal BAT<0>. The counting operation of the second bank address counter 120 is reset in response to the reset signal RST.

The third bank address counter 130 may output the bank selection signal BAT<2> by counting the bank selection signal BAT<1>. The counting operation of the third bank address counter 130 is reset in response to the reset signal RST.

Figure 3:
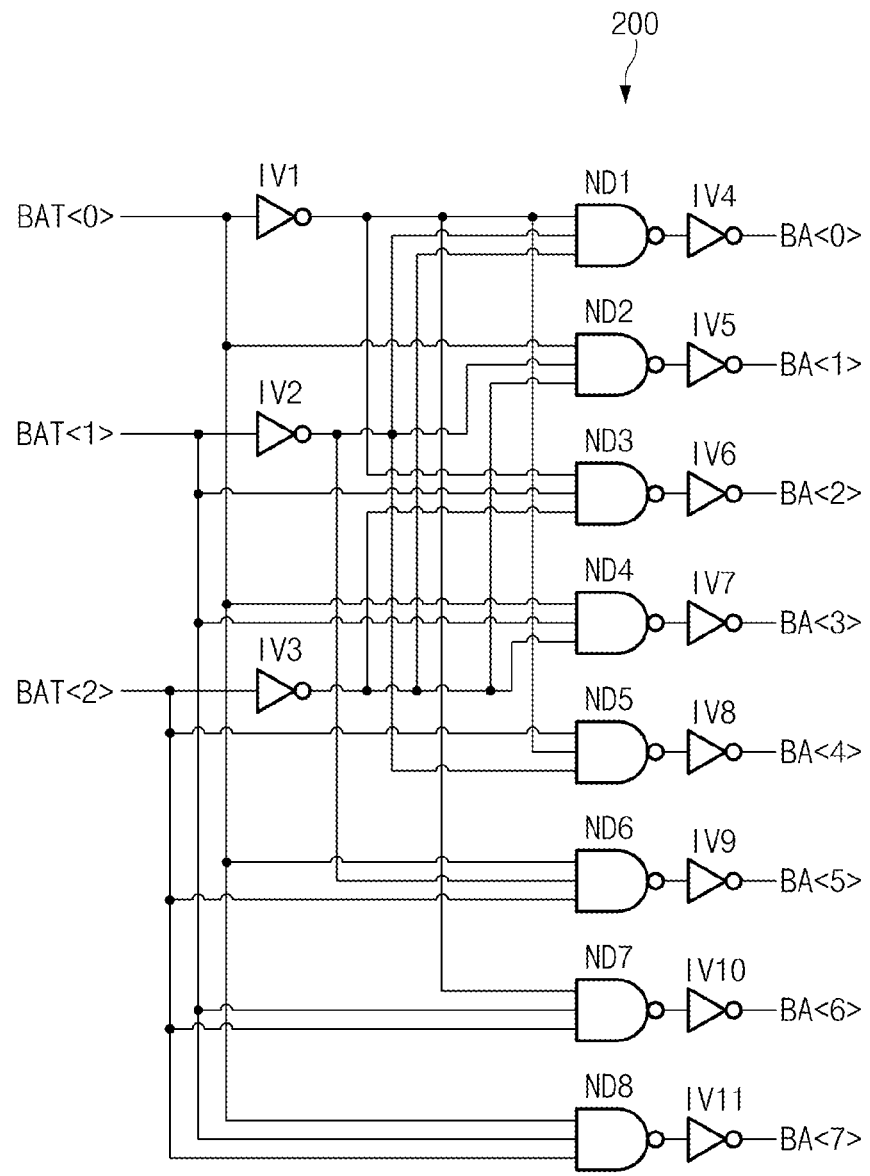
FIG. 3 shows a detailed construction of a bank address decoder shown in FIG. 1.

FIG. 3 shows a detailed construction of the bank address decoder 200 shown in FIG. 1.

The bank address decoder 200 may include a plurality of inverters IV1~IV11 and a plurality of NAND gates ND1~ND8. The bank address decoder 200 may output the bank addresses BA<0:7> to the precharge controller 400 by decoding the bank selection signals BAT<0:2>.

The NAND gate ND1 performs NAND operation on the bank selection signal BAT<0> inverted by the inverter IV1, the bank selection signal BAT<1> inverted by the inverter IV2, and the bank selection signal BAT<2> inverted by the inverter IV3. Furthermore, the inverter IV4 outputs the bank address BA<0> by inverting the output of the NAND gate ND1.

Furthermore, the NAND gate ND2 performs NAND operation on the bank selection signal BAT<0>, the bank selection signal BAT<1> inverted by the inverter IV2, and the bank selection signal BAT<2> inverted by the inverter IV3. Furthermore, the inverter IV5 outputs the bank address BA<1> by inverting the output of the NAND gate ND2.

Furthermore, the NAND gate ND3 performs NAND operation on the bank selection signal BAT<0> inverted by the inverter IV1, the bank selection signal BAT<1>, and the bank selection signal BAT<2> inverted by the inverter IV3. Furthermore, the inverter IV6 outputs the bank address BA<2> by inverting the output of the NAND gate ND3.

Furthermore, the NAND gate ND4 performs NAND operation on the bank selection signal BAT<0>, the bank selection signal BAT<1>, and the bank selection signal BAT<2> inverted by the inverter IV3. Furthermore, the inverter IV7 outputs the bank address BA<3> by inverting the output of the NAND gate ND4.

Furthermore, the NAND gate ND5 performs NAND operation on the bank selection signal BAT<0> inverted by the inverter IV1, the bank selection signal BAT<1> inverted by the inverter IV2, and the bank selection signal BAT<2>. Furthermore, the inverter IV8 outputs the bank address BA<4> by inverting the output of the NAND gate ND5.

Furthermore, the NAND gate ND6 performs NAND operation on the bank selection signal BAT<0>, the bank selection signal BAT<1> inverted by the inverter IV2, and the bank selection signal BAT<2>. Furthermore, the inverter IV9 outputs the bank address BA<5> by inverting the output of the NAND gate ND6.

Furthermore, the NAND gate ND7 performs NAND operation on the bank selection signal BAT<0> inverted by the inverter IV1, the bank selection signal BAT<1>, and the bank selection signal BAT<2>. Furthermore, the inverter IV10 outputs the bank address BA<6> by inverting the output of the NAND gate ND7.

Furthermore, the NAND gate ND8 performs NAND operation on the bank selection signal BAT<0>, the bank selection signal BAT<1>, and the bank selection signal BAT<2>. Furthermore, the inverter IV11 outputs the bank address BA<7> by inverting the output of the NAND gate ND8.

Figure 4:
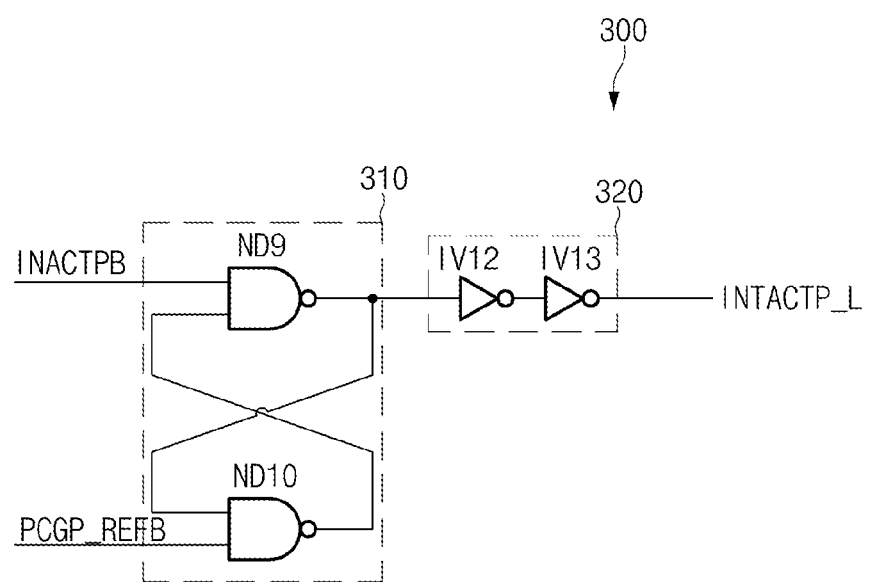
FIG. 4 shows a detailed construction of a latch unit shown in FIG. 1.

FIG. 4 shows a detailed construction of the latch unit 300 shown in FIG. 1.

The latch unit 300 may output the active latch signal INTACTP_L to the precharge controller 400 by latching the active signal INACTPB for a specific time in response to the refresh signal PCGP_REFB. The latch unit 300 may include a latch 310 and a delay unit 320.

The latch 310 may include NAND gates ND9 and ND10 that are coupled in a latch structure form. The latch 310 latches the active signal INACTPB for a specific time in response to the refresh signal PCGP_REFB. Furthermore, the delay unit 320 may output the active latch signal INTACTP_L by delaying the output of the latch unit 310 for a specific time.

Figure 5:
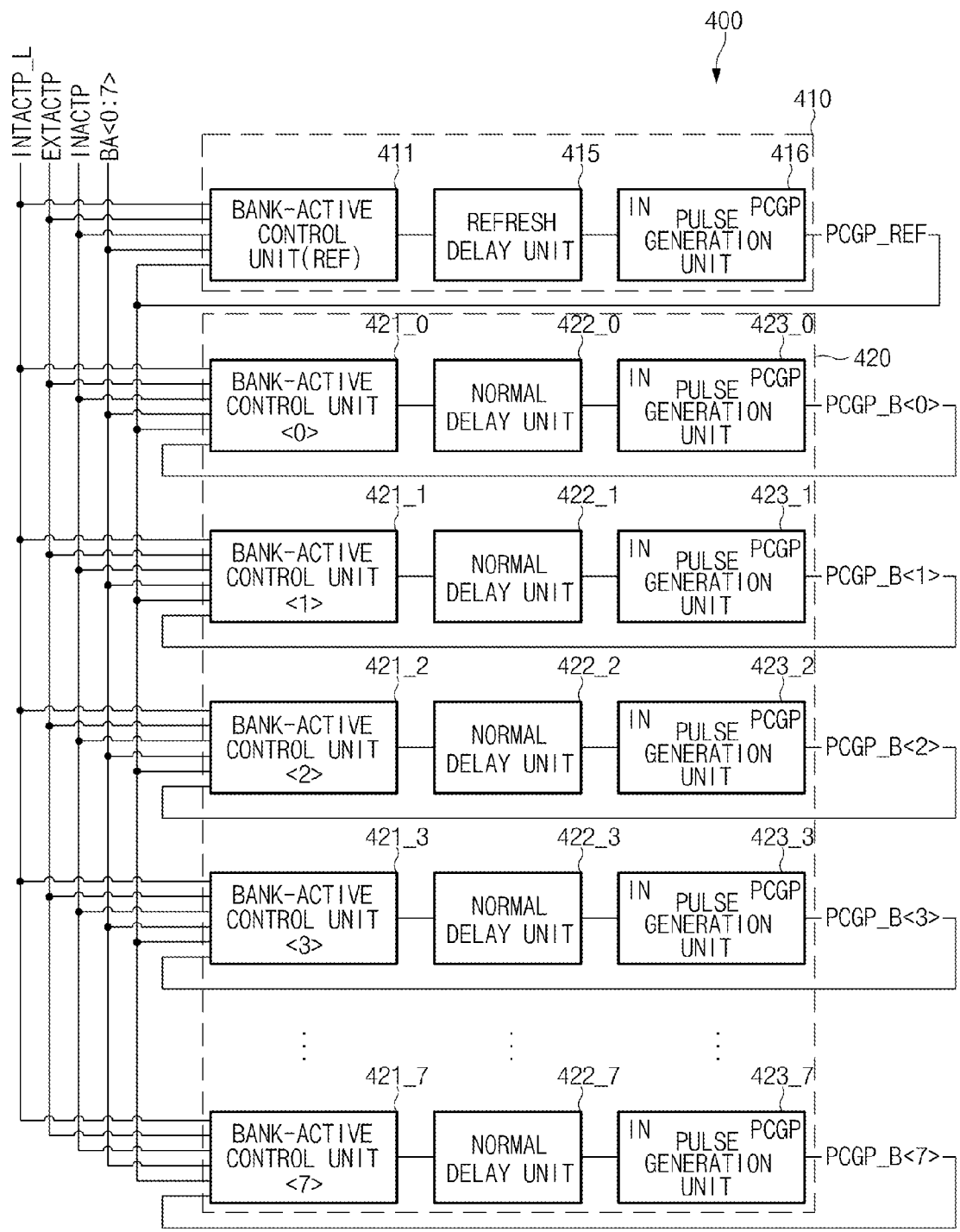
FIG. 5 shows a detailed construction of a precharge controller shown in FIG. 1.

FIG. 5 shows a detailed construction of the precharge controller 400 shown in FIG. 1.

The precharge controller 400 may include a refresh control unit 410 and a precharge signal generation unit 420.

The refresh control unit 410 may output the refresh signal PCGP_REF in response to the bank addresses BA<0:7>, the active command signal EXTACTP, the active latch signal INTACTP_L, and the active signal INACTP.

The refresh control unit 410 includes a bank-active control unit 411, a refresh delay unit 415, and a pulse generation unit 416.

The bank-active control unit 411 controls a bank-active operation in response to the active command signal EXTACTP, the active signal INACTP, the active latch signal INTACTP_L, and the bank address BA. Furthermore, the bank-active control unit 411 receives the refresh signal PCGP_REF fed back by the pulse generation unit 416.

Furthermore, when a refresh operation is performed, the refresh delay unit 415 controls the delay time of a signal applied by the bank-active control unit 411. For example, when a refresh operation is performed, the refresh delay unit 415 controls the delay operation of a minimum row-active time tRASMIN. The pulse generation unit 416 generates the refresh signal PCGP_REF in accordance with the output of the refresh delay unit 415.

The minimum row-active time tRASMIN is the time for determining a delay time for a refresh start signal. That is, the minimum row-active time tRASMIN may be defined in the specifications and is a minimum time that needs to be guaranteed before a precharge command after an active command is applied.

When an active command is applied, a corresponding memory cell may be activated, and thus a bit line sense amplifier senses and amplifies the data of the memory cell. The data of the memory cell is not lost only when a precharge command is applied after the sense and amplification of the bit line sense amplifier are terminated. That is, the minimum row-active time tRASMIN is a minimum delay time that needs to prevent cell data from being lost by guaranteeing the active section of a semiconductor memory device.

A conventional active control device includes additional refresh delay units 415, corresponding to the number of banks, in each bank in order to control the delay operation of a normal RAS access time tRAS when a refresh operation is performed. The normal RAS access time tRAS means the time that needs to be secured in order to complete a read or write operation.

In an embodiment, however, the precharge controller 400 controls the delay operation of the minimum row-active time tRASMIN using one common refresh delay unit 415 in accordance with all bank-active operations during a refresh operation. That is, all banks use one refresh delay unit 415 in common during a refresh operation.

That is, in the case of a refresh operation, a refresh row cycle time tRFC is longer than the RAS access time tRAS. Accordingly, when a refresh operation is performed, the refresh delay unit 415 can be used in common in accordance with all bank-active operations.

Here, a delay time assigned by the refresh row cycle time tRFC is for placing a point of time at which a refresh end signal is activated within a refresh cycle RFC. The refresh cycle defines the time during which a specific word of all banks within a semiconductor memory device needs to perform refresh in response to the activation of one internal refresh signal.

That is, the refresh row cycle time tRFC assigns additional delay to a RAS section signal whose a minimum row-active time tRASMIN has been guaranteed from the activation of a bank address so that the refresh end signal satisfies a refresh row cycle time tRFC according to the specifications.

Furthermore, the precharge signal generation unit 420 may include a plurality of bank-active control units 421_0~421_7, a plurality of normal delay units 422_0~422_7, and a plurality of pulse generation units 423_0~423_7.

The plurality of bank-active control units 421_0~421_7 may control a bank-active operation in response to the active latch signal INTACTP_L, the active command signal EXTACTP, the active signal INACTP, and the bank address BA.

Furthermore, each of the plurality of normal delay units 422_0~422_7 may control the delay time of each of signals received from the plurality of bank-active control units 421_0~421_7. The precharge signal generation unit 420 secures the RAS access time tRAS by controlling the delay operation of the minimum row-active time tRASMIN through the normal delay units 422_0~422_7 configured in the respective banks.

For example, the plurality of normal delay units 422_0~422_7 may control the delay operation of the minimum row-active time tRASMIN when a normal operation is performed. The plurality of pulse generation units 423_0~423_7 may generate the respective bank precharge signals PCGP_B<0:7> in accordance with the outputs of the plurality of normal delay units 422_0~422_7.

In the precharge controller 400, the refresh signal PCGP_REF, that is, the output of the refresh control unit 410, is inputted to the precharge signal generation unit 420. Furthermore, in the precharge signal generation unit 420, the bank precharge signals PCGP_B output from the respective pulse generation units 423_0~423_7 are inputted to the respective bank-active control units 421_0~421_7 as input signals.

Figure 6:
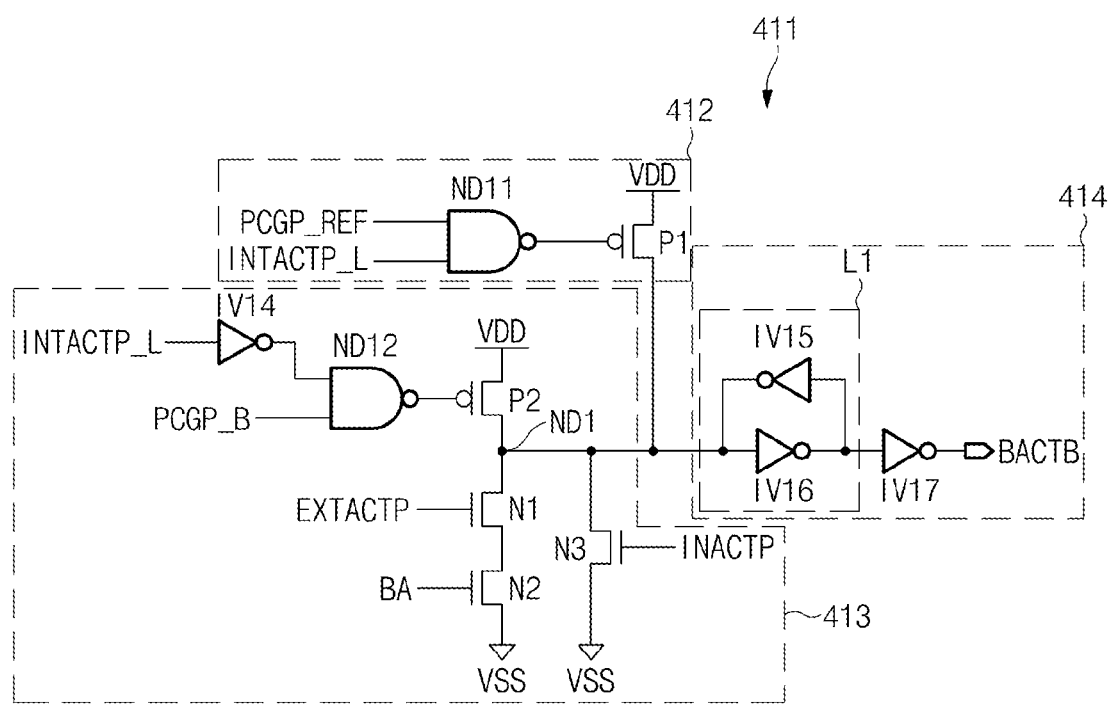
FIG. 6 is a detailed circuit diagram of a bank-active control unit shown in FIG. 5.

FIG. 6 is a detailed circuit diagram of the bank-active control unit 411 shown in FIG. 5. The internal circuits of the bank-active control units 421_0~421_7 are the substantially the same as that of the bank-active control unit 411, and thus a detailed construction of the bank-active control unit 411 is described as an example.

The bank-active control unit 411 may include a refresh input unit 412, an active control unit 413, and an output unit 414. The refresh input unit 412 may include a NAND gate ND11 and a PMOS transistor P1.

The NAND gate ND11 performs NAND operation on the refresh signal PCGP_REF and the active latch signal INTACTP_L and outputs a result of the NAND operation. The PMOS transistor P1 is coupled between a power source voltage terminal VDD and a node ND1 and supplied with the output of the NAND gate ND11 through the gate terminal of the PMOS transistor P1.

The active control unit 413 may include an inverter IV14, a NAND gate ND12, a PMOS transistor P2, and a plurality of NMOS transistors N1~N3.

The NAND gate ND12 performs a NAND operation on the active latch signal INTACTP_L, inverted by the inverter IV14, and the bank precharge signal PCGP_B and outputs a result of the NAND operation. Furthermore, the PMOS transistor P2 and the NMOS transistors N1 and N2 are coupled in series between the power source voltage terminal VDD and a ground voltage terminal VSS.

The PMOS transistor P2 is supplied with the output of the NAND gate ND12 through the gate terminal of the PMOS transistor P2. The NMOS transistor N1 is supplied with an active command signal EXTACTP through the gate terminal of the NMOS transistor N1. The NMOS transistor N2 is supplied with a bank address BA through the gate terminal of the NMOS transistor N2.

The active command signal EXTACTP is a command signal for activating the bank-active signal BACTB. Furthermore, the bank address BA may include address information for selecting corresponding bank-active control units 421_0~421_7. The NMOS transistor N3 is coupled between the node ND1 and the ground voltage terminal VSS and supplied with the active signal INACTP through the gate terminal of the NMOS transistor N3.

The output unit 414 may include a latch L1 and an inverter IV17. The latch L1 may include an inverter IV15 and an inverter IV16 coupled in a latch structure form. The latch L1 delays the output of the node ND1 for a specific time. The inverter IV17 outputs the bank-active signal BACTB by inverting the output of the latch L1.

Figure 7:
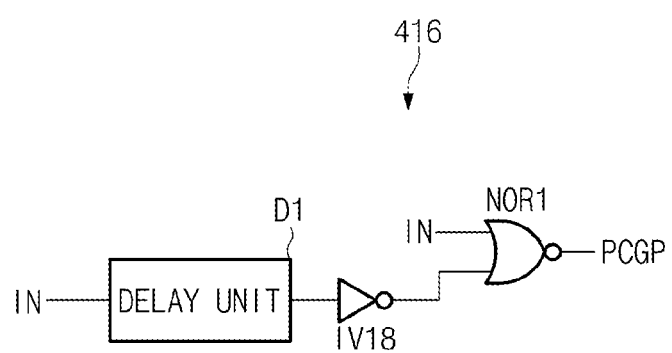
FIG. 7 is a detailed circuit diagram of a pulse generation unit shown in FIG. 5.

FIG. 7 is a detailed circuit diagram of the pulse generation unit 416 shown in FIG. 5. The internal circuits of the respective pulse generation units 423_0~423_7 are substantially the same as that of the pulse generation unit 416, and thus a detailed construction of the pulse generation unit 416 is described as an example.

The pulse generation unit 416 may include a delay unit D1, an inverter IV18, and a NOR gate NOR1. The delay unit D1 delays an input signal IN for a specific time and outputs a delayed signal. The inverter IV18 inverts the output of the delay unit D1. Furthermore, the NOR gate NOR1 outputs the precharge pulse signal PCGP by performing NOR operation on the output of the inverter IV18 and the input signal IN. Here, the precharge pulse signal PCGP means the bank precharge signal PCGP_B.

Figure 8:
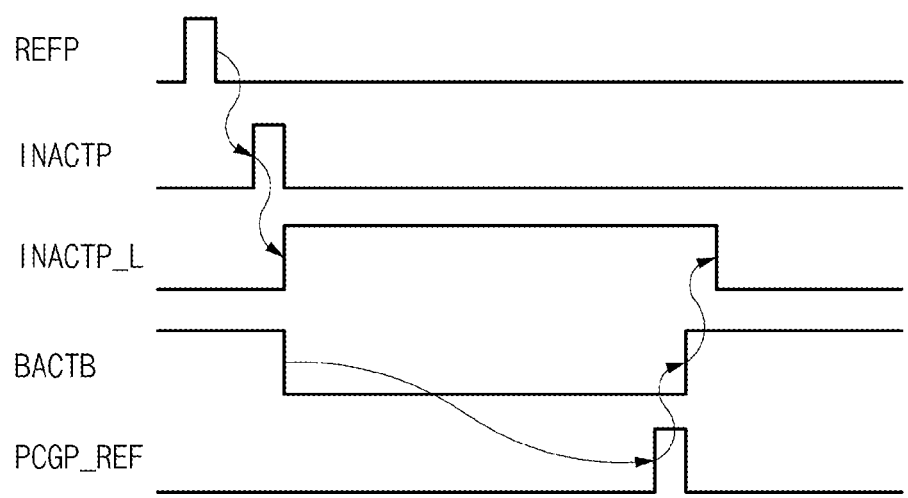
FIGS. 8 and 9 are operational timing diagrams illustrating the active control device in accordance with an embodiment.

FIG. 8 is an operational timing diagram illustrating the operation of the precharge controller 400 of the active control device in accordance with an embodiment. FIG. 8 is an operational timing diagram regarding the refresh control unit 410.

First, in a refresh operation, when a refresh command REFP is applied from the outside, the active signal INACTP including information about a bank is activated in a high level after a lapse of a specific delay time internally. In response thereto, the latch 310 of the latch unit 300 latches the active signal INACTPB and the refresh signal PCGP_REFB. Here, the active signal INACTPB and the refresh signal PCGP_REFB are the inverted signals of the active signal INACTP and the refresh signal PCGP_REF.

Furthermore, the delay unit 320 outputs the active latch signal INTACTP_L of a high level by performing non-inversion delay on the output of the latch 310.

If the refresh signal PCGP_REF is in a low level in the state in which the active latch signal INTACTP_L has been activated in a high level, the output of the NAND gate ND11 becomes a high level, and thus the PMOS transistor P1 is turned off. Furthermore, if the bank precharge signal PCGP_B is in a low level in the state in which the active latch signal INTACTP_L has been activated in a high level, the output of the NAND gate ND12 becomes a high level, and thus the PMOS transistor P2 is turned off.

Furthermore, when the active signal INACTP is activated in a high level, the NMOS transistor N3 is turned on, and thus voltage of the node ND1 becomes a low level. Accordingly, the bank-active signal BACTB output from the bank-active control unit 411 shifts to a low level.

In response thereto, the pulse generation unit 416 maintains a low level and then outputs the refresh signal PCGP_REF shifted to a high level in response to the bank-active signal BACTB, after a lapse of the delay time of the delay unit D1.

Furthermore, the bank-active control unit 411 receives the refresh signal PCGP_REF fed back by the pulse generation unit 416. Accordingly, if the refresh signal PCGP_REF shifts to a high level, the output of the NAND gate ND11 shifts to a low level. In response thereto, the PMOS transistor P1 is turned on, and thus voltage of the node ND1 shifts to a high level. Accordingly, the bank-active signal BACTB shifts to a high level again.

Furthermore, if the bank-active signal BACTB shifts to a high level and the active signal INACTPB shifts to a low level, the active latch signal INTACTP_L shifts to a low level again in response to the refresh signal PCGP_REF.

In an embodiment, the refresh signal PCGP_REF is delayed during a latch time when the active latch signal INTACTP_L is activated in a high level so that the RAS access time tRAS can be secured when a refresh operation is performed.

Figure 9:
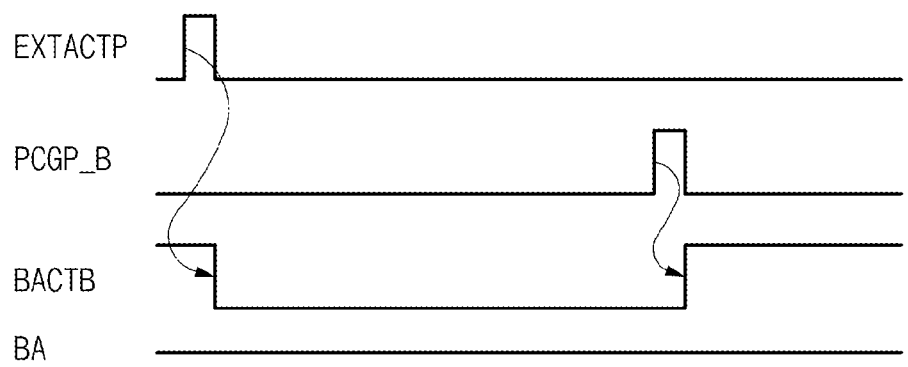

FIG. 9 is an operational timing diagram illustrating the operation of the precharge controller 400 of the active control device in accordance with an embodiment. FIG. 9 is an operational timing diagram illustrating of the precharge signal generation unit 420.

First, when the active command signal EXTACTP is activated to a high level, the NMOS transistor N1 is turned on. Here, the active command signal EXTACTP is a signal that shifts to an active state of a high level when an active command is applied from the outside. In this state, when the bank address BA for selecting a corresponding bank is applied in a high level, the NMOS transistor N2 is turned on.

In response thereto, voltage of the node ND1 becomes a low level, and thus the bank-active signal BACTB shifts to a low level. At this time, the bank precharge signal PCGP_B maintains a low level. Thereafter, when the bank-active signal BACTB shifts to a low level, the bank precharge signal PCGP_B shifts to a high level again after a lapse of the delay time of the delay unit D1.

The bank-active control unit 421_0 receives the bank precharge signal PCGP_B fed back by the pulse generation unit 423_0. When the bank precharge signal PCGP_B shifts to a high level, the PMOS transistor P2 is turned on. Accordingly, voltage of the node ND1 becomes a high level, and thus the bank-active signal BACTB shifts to a high level again.

Accordingly, when the active command signal EXTACTP is activated in a high level, a precharge operation is performed on each of the banks of the core region 500 during a section in which the bank-active signal BACTB is activated in a low level.

In accordance with the embodiments, the area of the active control device may be reduced because all banks use one refresh delay unit in common during a refresh operation.

Furthermore, the embodiments have an advantage in that area efficiency of a semiconductor device can be improved because a delay circuit occupying a relatively large area is not used.

Figure 10:
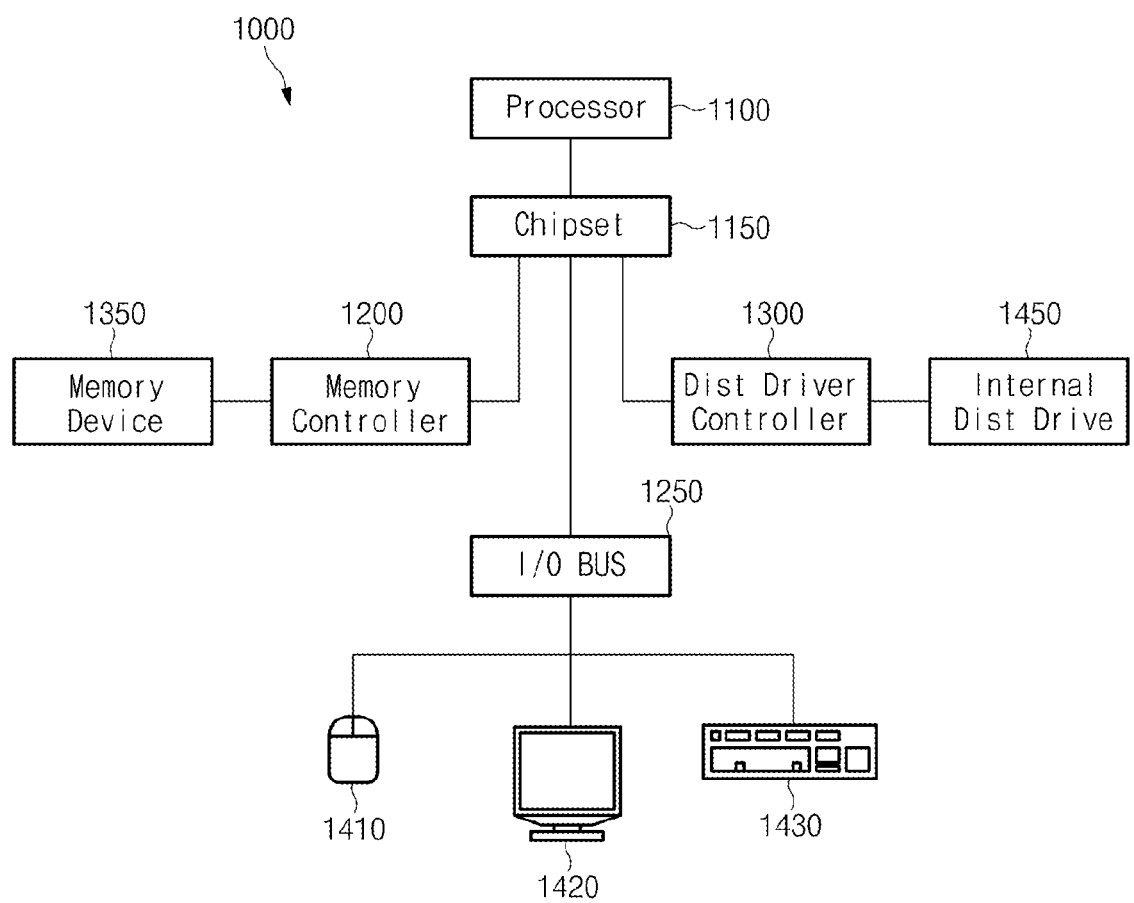
FIG. 10 illustrates a block diagram of a system employing the semiconductor device and/or active control device in accordance with the embodiments discussed above with relation to FIGS. 1-9.

The semiconductor device and/or active control device discussed above is particular useful in the design of memory devices, processors, and computer systems. For example, referring to FIG. 10, a block diagram of a system employing a semiconductor device and/or active control device in accordance with the embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device and/or active control device as discussed above with reference to FIGS. 1-9. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor device and/or active control device discussed above with relation to FIGS. 1-9, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 10 is merely one example of a system employing the semiconductor device and/or active control device as discussed above with relation to FIGS. 1-9. In alternate embodiments, such as cellular phones or digital cameras, the components may differ from the embodiments shown in FIG. 10.

While certain embodiments have been described above, it will be understood to those skilled in the art that the embodiments described are by way of example only. Accordingly, the active control device and the semiconductor device including the same should not be limited based on the described embodiments. Rather, the device described herein should only be limited in light of the claims that follow when taken in conjunction with the above description and accompanying drawings.

What is claimed is:

1. An active control device, comprising:
    a bank-active control unit configured for outputting the bank-active signal in response to refresh command and a refresh signal that has been fed back;
    a refresh delay unit for delaying the bank-active signal for a predetermined minimum row-active time and outputting a delay signal, and the refresh delay unit is used a plurality of banks in common;
    a pulse generation unit configured for generating the refresh signal in accordance with the output of the refresh delay unit; and
    a precharge signal generation unit configured for generating a bank precharge signal for precharging a bank in response to the refresh signal.

2. The active control device of claim 1, wherein
    the bank-active control unit configured for outputting the bank-active signal in response to a bank address, an active command signal, an active latch signal, an active signal, and the refresh signal that has been fed back from the pulse generation unit.

3. The active control device of claim 2, wherein the bank-active control unit comprises:
    a refresh input unit configured for selectively supplying a power source voltage to a first node in response to the refresh signal and the active latch signal;
    an active control unit configured for controlling a voltage level of the first node in response to the active latch signal, a fed-back bank precharge signal, the active command signal, the bank address, and the active signal; and
    an output unit for outputting the bank-active signal by latching the voltage level of the first node.

4. The active control device of claim 2, wherein the bank-active control unit delays and outputs the refresh signal during a latch time when the active latch signal is activated to a high voltage level.

5. The active control device of claim 2, wherein the active latch signal is generated by latching an inverted signal of the active signal and an inverted signal of the refresh signal.

6. The active control device of claim 2, wherein the bank-active signal output from the bank-active control unit is controlled in accordance with a voltage level of the active latch signal when the active signal is activated.

7. The active control device of claim 2, wherein the bank-active control unit activates the refresh signal after a lapse of a delay time of the refresh delay unit when the bank-active signal is activated.

8. The active control device of claim 2, wherein the active latch signal and the bank-active signal of the bank-active control unit are deactivated after a delay time of the pulse generation unit when the refresh signal is activated.

9. A semiconductor device, comprising:
    a bank address decoder configured for outputting a bank address by decoding a bank selection signal;
    a precharge controller configured for outputting a refresh signal by controlling a delay time for a refresh start time when a refresh operation is performed and configured for generating a bank precharge signal for precharging a bank in response to the refresh signal; and
    a core region configured for precharging a bank region in response to the bank precharge signal,
    wherein the precharge controller comprises:
    a bank-active control unit configured for outputting the bank-active signal in response to refresh command and a refresh signal that has been fed back;
    a refresh delay unit for delaying the bank-active signal for a predetermined minimum row-active time and outputting a delay signal, and the refresh delay unit is used a plurality of banks in common;
    a pulse generation unit configured for generating the refresh signal in accordance with the output of the refresh delay unit; and
    a precharge signal generation unit configured for generating a bank precharge signal for precharging a bank in response to the refresh signal.

10. The semiconductor device of claim 9,
    wherein the bank-active control unit configured for outputting the bank-active signal in response to a bank address, an active command signal, an active latch signal, an active signal, and the refresh signal that has been fed back from the pulse generation unit.

11. The semiconductor device of claim 10, wherein the bank-active control unit comprises:

a refresh input unit configured for selectively supplying a power source voltage to a first node in response to the refresh signal and the active latch signal;

an active control unit configured for controlling a voltage level of the first node in response to the active latch signal, the fed-back bank precharge signal, the active command signal, the bank address, and the active signal; and an output unit configured for outputting the bank-active signal by latching the level of the first node.

12. The semiconductor device of claim 10, wherein the bank-active control unit delays and outputs the refresh signal during a latch time when the active latch signal is activated to a high voltage level.

13. The semiconductor device of claim 10, wherein the active latch signal is generated by latching an inverted signal of the active signal and an inverted signal of the refresh signal.

14. The semiconductor device of claim 10, wherein the bank-active signal output from the bank-active control unit is controlled in accordance with a voltage level of the active latch signal when the active signal is activated.

15. The semiconductor device of claim 10, wherein the bank-active control unit activates the refresh signal after a lapse of a delay time of the refresh delay unit when the bank-active signal is activated.

16. The semiconductor device of claim 10, wherein the active latch signal and the bank-active signal of the bank-active control unit are deactivated after a delay time of the pulse generation unit when the refresh signal is activated.

17. A system comprising:
a processor;
a chipset configured to couple with the processor;
a memory controller configured to receive a request provided from the processor through the chipset; and
an active control device configured to receive the request and output data to the memory controller, the active control device comprising:
a bank-active control unit configured for outputting the bank-active signal in response to refresh command and a refresh signal that has been fed back;
a refresh delay unit for delaying the bank-active signal for a predetermined minimum row-active time and outputting a delay signal, and the refresh delay unit is used a plurality of banks in common;
a pulse generation unit configured for generating the refresh signal in accordance with the output of the refresh delay unit; and
a precharge signal generation unit configured for generating a bank precharge signal for precharging a bank in response to the refresh signal.

* * * * *